United States Patent
Machida et al.

(10) Patent No.: US 11,411,259 B2
(45) Date of Patent: Aug. 9, 2022

(54) BATTERY CONTROL UNIT

(71) Applicant: Hitachi Automotive Systems, Ltd., Hitachinaka (JP)

(72) Inventors: Akihiro Machida, Hitachinaka (JP); Tatsumi Yamauchi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 183 days.

(21) Appl. No.: 16/333,533

(22) PCT Filed: Nov. 10, 2017

(86) PCT No.: PCT/JP2017/040529
§ 371 (c)(1),
(2) Date: Mar. 14, 2019

(87) PCT Pub. No.: WO2018/101005
PCT Pub. Date: Jun. 7, 2018

(65) Prior Publication Data
US 2019/0260095 A1 Aug. 22, 2019

(30) Foreign Application Priority Data
Nov. 30, 2016 (JP) .............................. JP2016-231985

(51) Int. Cl.
*H01M 10/48* (2006.01)
*H02J 7/04* (2006.01)
(Continued)

(52) U.S. Cl.
CPC ............ *H01M 10/48* (2013.01); *G01R 19/00* (2013.01); *H01M 50/20* (2021.01); *H01M 50/50* (2021.01);
(Continued)

(58) Field of Classification Search
None
See application file for complete search history.

(56) References Cited

U.S. PATENT DOCUMENTS

2006/0091858 A1    5/2006  Johnson
2013/0128396 A1*   5/2013  Danesh .............. G01R 19/2506
                                                        361/45
(Continued)

FOREIGN PATENT DOCUMENTS

JP    2005-150079 A    6/2005
JP    2010-122194 A    6/2010
(Continued)

OTHER PUBLICATIONS

International Search Report issued in corresponding application No. PCT/JP2017/040529, dated Jan. 23, 2018.

*Primary Examiner* — Haroon S. Sheikh
(74) *Attorney, Agent, or Firm* — Foley & Lardner LLP

(57) ABSTRACT

The invention is directed to provide a battery pack in which a current sensor is eliminated and the whole size is reduced. In order to solve the problem described above, a battery pack of the invention includes a battery group in which a plurality of battery cells (lithium ion battery 11, 12) are connected in series, a resistor (bus bar 20) connected in series to the battery group, cell voltage detection lines (cell voltage detection lines 101 to 104) arranged at both ends of the battery cells (lithium ion battery 11, 12) and the resistor (bus bar 20), and a battery controller connected to the cell voltage detection lines (cell voltage detection lines 101 to 104), in which one cell voltage detection line (cell voltage detection lines 101 to 104) adjacent to the battery cell (lithium ion battery 11, 12) includes a terminal which is branched and connected to the battery controller.

9 Claims, 5 Drawing Sheets

(51) Int. Cl.
*H02J 7/00* (2006.01)
*H02J 7/02* (2016.01)
*G01R 19/00* (2006.01)
*H01M 50/20* (2021.01)
*H01M 50/50* (2021.01)

(52) U.S. Cl.
CPC ................ *H02J 7/00* (2013.01); *H02J 7/02* (2013.01); *H02J 7/04* (2013.01)

(56) References Cited

U.S. PATENT DOCUMENTS

| | | | |
|---|---|---|---|
| 2014/0225622 A1* | 8/2014 | Kudo | ................ B60L 58/13 324/433 |
| 2016/0233700 A1* | 8/2016 | Muto | ................ B60L 58/15 |
| 2017/0089955 A1 | 3/2017 | Yugou | |

FOREIGN PATENT DOCUMENTS

| | | |
|---|---|---|
| JP | 2014-179237 A | 9/2014 |
| JP | 2015-068821 A | 4/2015 |
| JP | 2016-146728 A | 8/2016 |
| WO | WO 2016/047010 A1 | 3/2016 |

\* cited by examiner

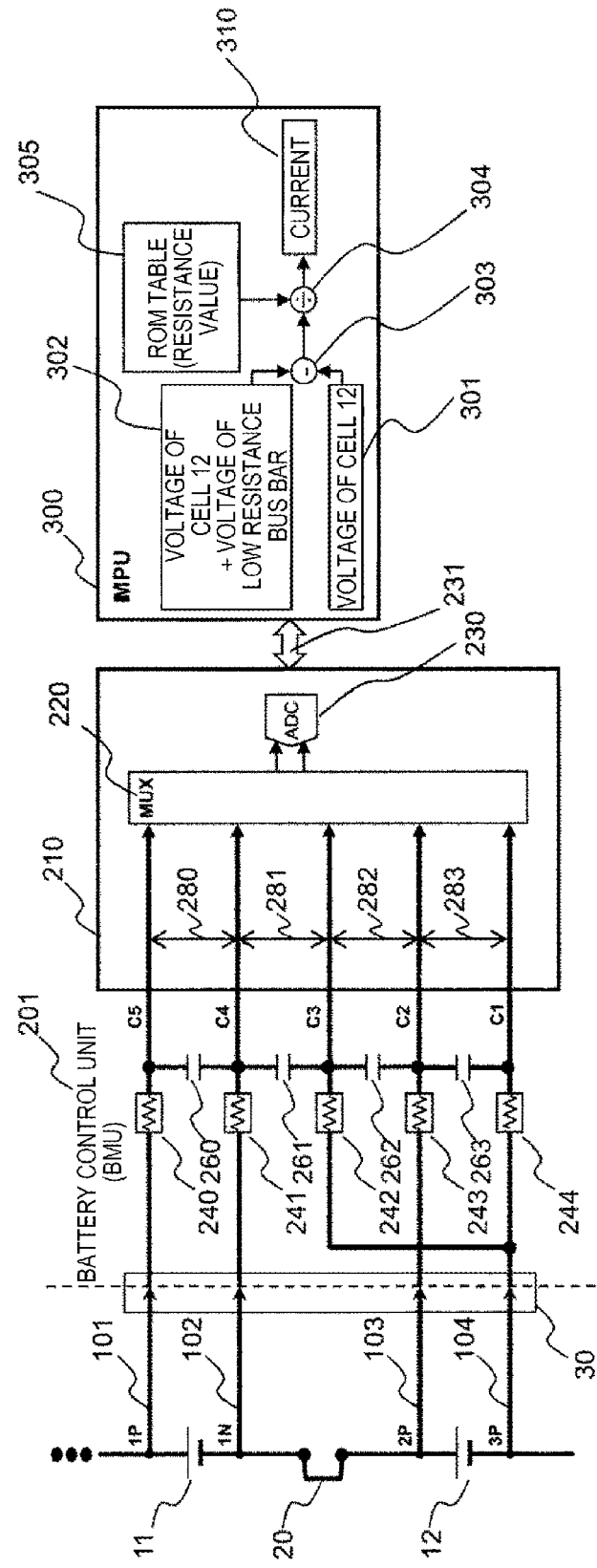
[FIG. 1]

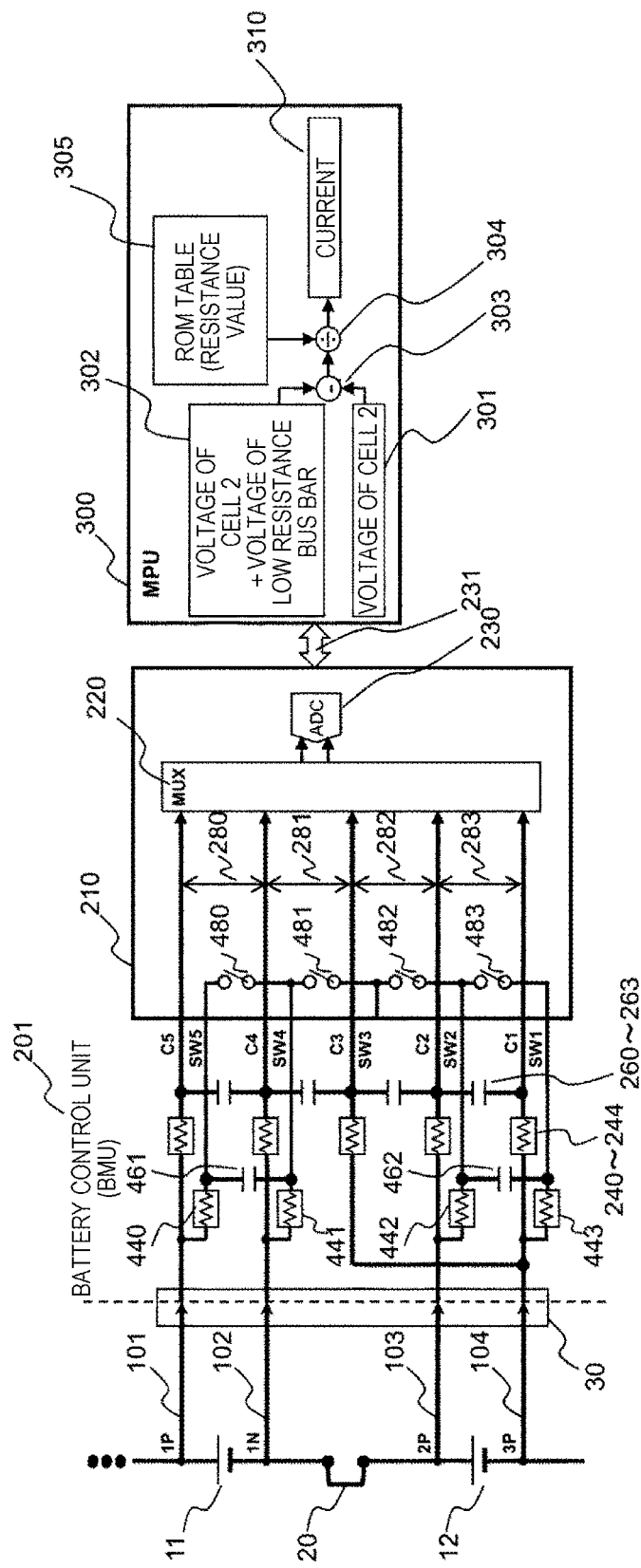
[FIG. 2]

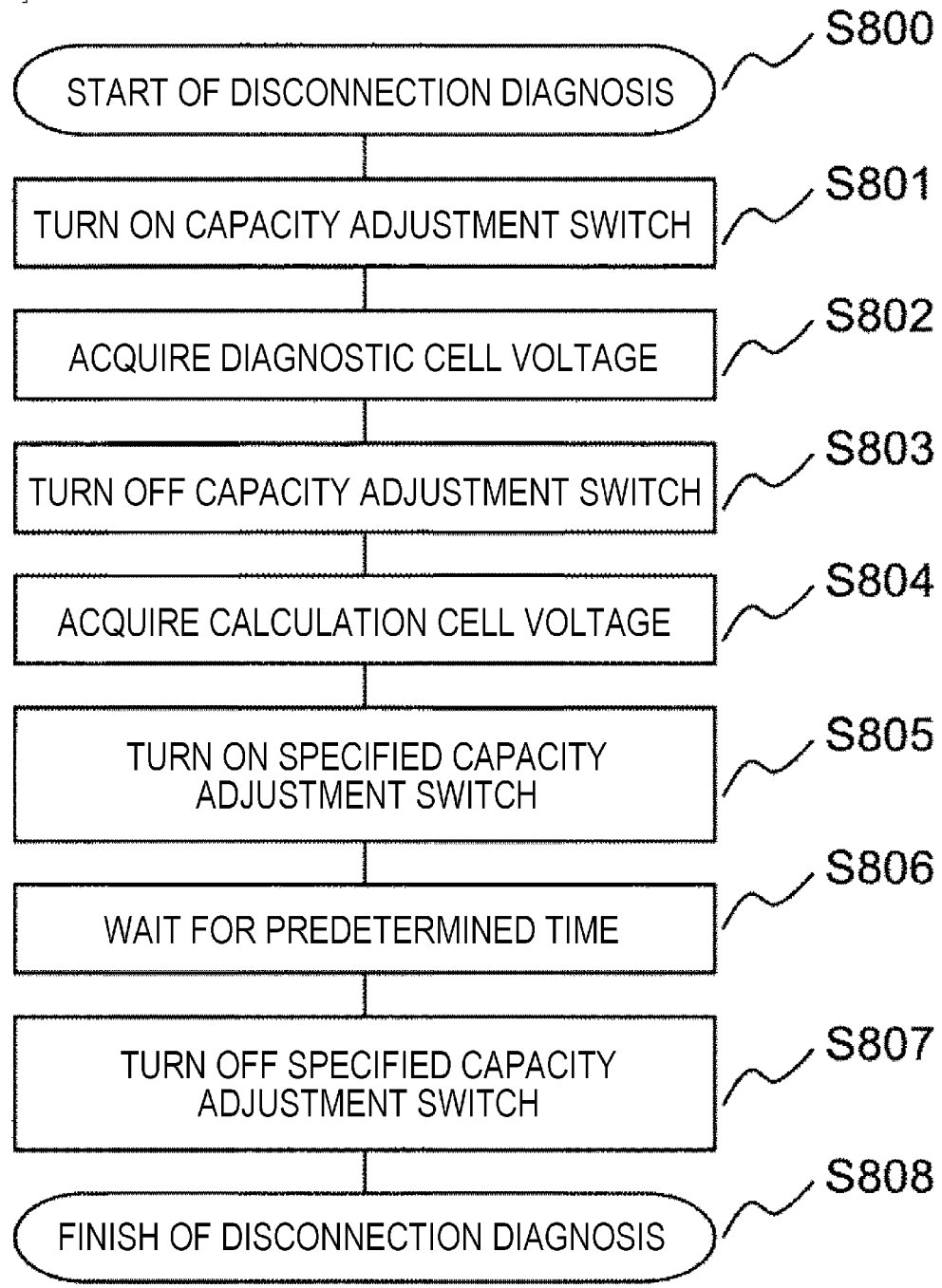
[FIG. 3]

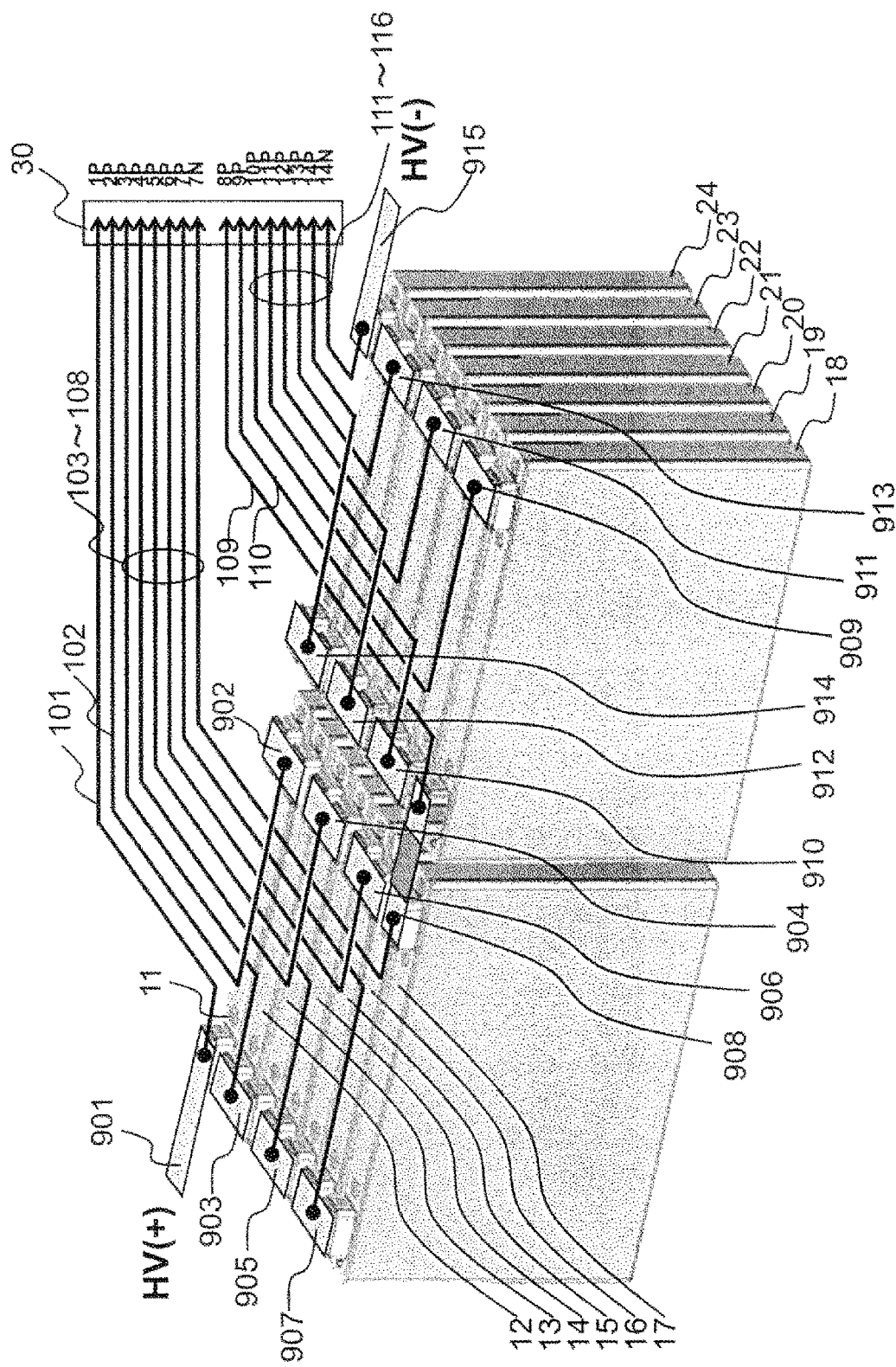

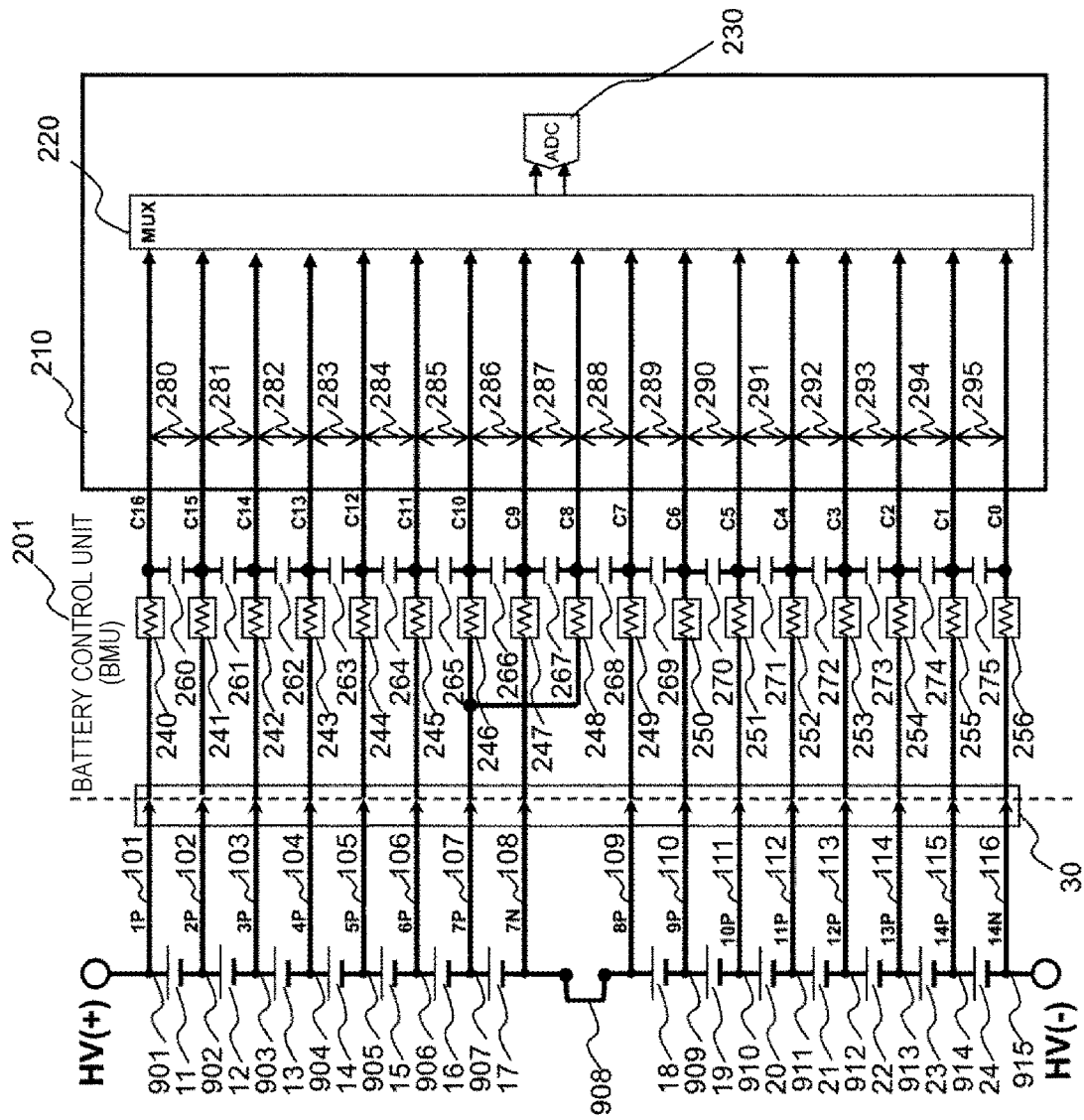

BATTERY CONTROL UNIT

TECHNICAL FIELD

The present invention relates to a battery control unit capable of measuring and controlling a current between a battery and an inverter.

BACKGROUND ART

In an electric vehicle and a hybrid vehicle, a battery module in which a plurality of assembled batteries in which a plurality of secondary battery cells (single cells) such as lithium single cells or the likes are connected in series-parallel are further connected in series or in series-parallel is used. In addition, a plurality of battery modules connected in series or in series-parallel are used as a power storage device together with a battery control unit for controlling those battery modules.

Normally, a current sensor is provided between those power storage devices and an inverter control device for driving a motor in order to supply electric power. There is a method where a magnetic core of the current sensor is disposed in a current path and the current sensor performs measuring by using a hall element which converts the strength of the magnetic field generated in the core into a voltage and there is also an example of measuring the voltage of both ends of the resistor disposed in series with the current path.

Generally, a vehicle equipped with a lithium ion battery includes a system to prevent overcharge or overdischarge in order to use the lithium ion battery safely. However, in recent years, as represented by the ISO26262 standard, the demand for safety of a vehicle has further increased.

In a vehicle equipped with a lithium ion battery, it is configured such that a system measures a charging or discharging current flowing to a battery and further diagnoses the accuracy of a current.

As a technique related to the present technical field, for example, JP-A-2005-150079 (PTL 1) is available. This patent document describes a method of measuring a current flowing between a control unit on a vehicle side and a battery control unit.

CITATION LIST

Patent Literature

PTL 1: JP-A-2005-150079

SUMMARY OF INVENTION

Technical Problem

In the related art, a current flowing in a battery is measured using two current sensors, and failure of the current sensor is diagnosed by a difference between the two current sensors.

However, for the two current sensors, a configuration is increased in size because two Hall ICs are provided in a gap of one magnetic core, for example, and thus an arrangement space of a system is oppressed.

In addition, since the two current sensors are configured with different architectures, it is necessary to separate a power supply and an A/D converter to be measured into two systems.

In order to solve the problem described above, according to the present invention, the current sensor provided in the battery control unit is eliminated using the cell voltage monitoring IC for measuring the battery voltage, so that the battery control unit can be downsized.

An object of the invention is to measure a current of a lithium ion battery with a cell voltage monitoring IC.

Solution to Problem

In order to solve the problem described above, a battery pack of the invention includes a battery group in which a plurality of battery cells (lithium ion battery 11, 12) are connected in series, a resistor (bus bar 20) connected in series to the battery group, cell voltage detection lines (cell voltage detection lines 101 to 104) arranged at both ends of the battery cells (lithium ion battery 11, 12) and the resistor (bus bar 20), and a battery controller connected to the cell voltage detection lines (cell voltage detection lines 101 to 104), in which one cell voltage detection line (cell voltage detection lines 101 to 104) adjacent to the battery cell (lithium ion battery 11, 12) includes a terminal which is branched and connected to the battery controller.

Advantageous Effects of Invention

According to the invention, there is an effect that a battery control unit for controlling a lithium ion battery can measure a current without using a current sensor.

BRIEF DESCRIPTION OF DRAWINGS

FIG. 1 is an example of a first configuration diagram of a battery control unit including a current measuring unit.

FIG. 2 is an example of a failure diagnosis of a cell voltage detection line.

FIG. 3 is a sequence example of the failure diagnosis of the cell voltage detection line.

FIG. 4 is an example of a configuration diagram of a lithium ion battery array including the current measuring means.

FIG. 5 is an example of a configuration diagram of a battery control unit including a current measuring unit.

DESCRIPTION OF EMBODIMENTS

Hereinafter, it will be described with reference to drawings of an example.

Example 1

In this Example, a method in which lithium ion batteries and a low resistance bus bar connecting terminals thereof are connected to a battery control unit and a current flowing in the lithium ion battery is measured will be described. Hereinafter, the similar components will be denoted by the same reference numerals and characters and description thereof will be omitted.

FIG. 1 is a diagram for explaining current measurement of the lithium ion battery according to this Example. A low resistance bus bar 20 is connected in series with lithium ion batteries 11 and 12 and voltages at both ends thereof are connected to a battery control unit 201 via a connector 30 by cell voltage detection lines 101 to 104.

In the low resistance bus bar 20, a voltage drop occurs in proportion to the current by the current flowing in the lithium ion battery and a positive voltage is generated at a positive current, and further a negative voltage is generated at a negative current.

Voltage input to the connector 30 is connected to a cell voltage monitoring IC via filter resistors 240 to 244. In this case, filter capacitors 260 to 263 are respectively disposed between terminals C1 to C5 of the cell voltage monitoring IC and noise components applied to the cell voltage monitoring IC are removed.

In the connection of the cell voltage monitoring IC, the lithium ion battery 11 is connected between the terminals C5 and C4 and the lithium ion battery 12 is connected between the terminals C2 and C1. In the connection of the cell voltage monitoring IC, the terminal C3 is connected to negative voltage of the lithium ion battery 12 and the voltage input between the terminals C4 and C3 of the cell voltage monitoring IC is connected to the voltage at which the voltage obtained by adding the voltage of the lithium ion battery 12 and the voltage of the low resistance bus bar 20 is detected. This point is one feature of the invention.

An MUX 220 in the cell voltage monitoring IC selects cell voltage 280 between the terminals C5 and C4, then voltage 281 between the terminals C4 and C3, then cell voltage 282 between the terminals C3 and C2 and cell voltage 283 between the terminals C2 and C1 are sequentially selected, thereby the voltages between the terminals are sequentially measured to an ADC 230.

The cell voltage monitoring IC successively transfers voltage information to an MPU 300 via an insulation communication unit 231.

The MPU stores the voltages sequentially measured and the voltage of the cell 12 and the voltage of the low resistance bus bar are measured in the cell voltage 281, and further the cell voltage 283 is subtracted in a subtractor 303.

A calculated value of the subtractor is divided by a value of a ROM table 305 by a divider 304, thereby a current value 310 can be obtained by calculation. In this case, by storing the resistance of the low resistance bus bar 20 in advance in the ROM table 305, the battery current can be calculated. Voltage information input to the MPU 300 via the insulation unit 231 includes the subtractor 303 which takes the difference between a measuring portion 302 for measuring the sum (voltage in 281 in FIG. 1) of the voltage of the lithium ion battery 12 in the MPU 300 and the voltage of the low resistance bus bar 20 and a measuring portion 301 for measuring the voltage of the lithium ion battery 12 and. Then, the information output from the subtractor 303 is input to the divider 304, the resistance value of the low resistance bus bar 20 output from the RAM table 305 is divided to calculate a current value. Further, when the current value is calculated, it may be corrected based on the magnitude of the voltage. In this case, it is preferable to use a coefficient which exhibits similar behaviors in the discharge direction and charging direction around 0 V as a center.

Next, a method in which the lithium ion batteries 11 and 12 and the low resistance bus bar 20 connecting the terminals thereof are connected to the battery control unit 201 and which is used for diagnosing the disconnection failure in the cell voltage detection lines 101 to 104 to be measured will be described. Hereinafter, the similar components will be denoted by the same reference numerals and characters and description thereof will be omitted. To explain the disconnection diagnosis, newly from the configuration in FIG. 1, the drawing further illustrates the following: the positive voltage of the lithium ion battery 11 is connected to a capacity adjustment switch 480 via a capacity adjustment resistor 440; the negative voltage of the lithium ion battery 11 is connected to the other side of the switch via a capacity adjustment resistor 441; a capacity adjustment filter capacitor 461 is connected to the capacity adjustment switch 480; and capacity adjustment resistors 442 and 443, a capacity adjustment switch 483, and a capacity adjustment filter capacitor 462 are added to the lithium ion battery 12.

FIG. 2 is a diagram for illustrating current measurement of the lithium ion battery according to this Example. The cell voltage detection line 101 of the positive voltage and the cell voltage detection line 102 of the negative voltage which measure the voltage of the lithium ion battery 11 and the cell voltage detection lone 103 of the positive voltage and the cell voltage detection line 104 of the negative voltage which measure the voltage of the lithium ion battery 12 are connected to the battery control unit 201 via the connector 30 by using an electric wire.

The capacity adjustment switch is commanded from the MPU 300 to a cell voltage monitor 1210 via the insulation communication unit 231. When the cell voltage of the lithium ion battery 11 is measured, whether each of the cell voltage detection lines 101 to 104 as the measurement unit is conducted is confirmed. By making the lithium ion batteries 11 and 12 discharged by the capacity adjustment resistors, a function of equalizing the capacities between the plurality of lithium ion batteries 11 and 12 is achieved. By using the capacity adjustment switches 480 to 483, the cell voltage 280 when the switch is in an ON state is measured, in such a manner that the disconnection of the cell voltage detection lines 101 to 104 is detected. When the disconnection occurs, the cell voltage is lower than the usual cell voltage.

FIG. 3 is a diagram for illustrating a flow of the disconnection diagnosis. First, the disconnection diagnosis is started in Step S800 and the capacity adjustment switch becomes in an ON state in Step S801. Next, in Step S802, values of the diagnostic cell voltages are sequentially measured by switching the MUX 220 by the cell voltage 280. The measurement result is sent to the MPU 300 via the insulation communication unit 231. Next, in Step S803, the capacity adjustment switch becomes in an OFF state and acquisition of the diagnostic cell voltage is finished. Then, the process proceeds to Step S804 and a calculation cell voltage is obtained. Next, similarly, the measurement result is sent to the MPU and the process proceeds to Step S805. Then, a specified capacity adjustment switch becomes in an ON state. After waiting for a predetermined time in Step S806, the capacity adjustment switch specified in Step S807 becomes in an OFF state and the sequence is finished in Step S807. In addition, While the battery control unit is in operation, this sequence from Step S800 to Step S808 is repeatedly performed to monitor the battery condition.

Here, when the diagnostic cell voltage value sent to the MPU drops below a certain threshold value, it is determined that the cell voltage detection line is disconnected and the system is informed of the abnormality. Further, it is detected that the measurement value of the current measuring unit of this Example is also abnormal and the lithium ion battery is protected.

The invention will be briefly summarized. The battery device of the invention includes a battery group in which a plurality of battery cells (lithium ion batteries 11 and 12) are connected in series, a resistor (bus bar 20) connected in series with the battery group, cell voltage detection lines (cell voltage detection lines 101 to 104) which are arranged in both ends of the battery cells (lithium ion batteries 11 and 12) and the resistor (bus bar 20), and a battery controller connected to the cell voltage detection lines (cell voltage detection lines 101 to 104), in which one cell voltage detection line (cell voltage detection lines 101 to 104) adjacent to the battery cell (lithium ion battery 11 or 12) has a terminal which is branched and connected to the battery controller. By adopting such a structure, it becomes possible to measure the current value flowing in the lithium ion battery without providing an additional current sensor. Since the number of the current sensors is reduced, cost reduction by the current sensor is achieved as compared with the prior art. Further, the number of the current sensors is reduced and this contributes to volume reduction of a battery pack. In addition, in the invention, a structure is adopted in which the low resistance bus bar 20 is disposed between the lithium ion battery 11 and the lithium ion battery 12. By adopting such a structure, it is possible to improve the current detection accuracy within a cell voltage usage range.

In the invention, an additional current sensor may be provided. By adopting such a configuration, the current detection can be performed by a double system. Therefore, it is possible to improve the reliability of the obtained current value and failure of the bus bar and failure of the current sensor can be monitored with each other.

Further, in the battery pack according to the invention, it is preferable that the battery controller 210 calculate the current flowing in the resistor (bus bar 20) in synchronization with the voltage detection of the battery cell. By adopting such a configuration, there is no deviation in the voltage value acquired by the voltage detection of the battery cell and the voltage detection of the resistor (bus bar 20), so that the accuracy of the acquired current value is improved.

In this Example, although the bus bar is used for the current measurement, another resistor may be provided. In that case, a wiring cable or the like is used instead of the bus bar.

Example 2

Next, Example 2 will be described. A difference from Example 1 is that the shape of the lithium ion batteries 11 and 12 is not defined in Example 1, but in the present example, the shape of the lithium ion battery is set to a rectangular lithium ion battery.

In lithium ion batteries 11 to 24, the other negative voltage of the positive voltage is joined to a next positive voltage by an inter-cell bus bar and fourteen cells are connected in series. In the middle of the connection, a portion between the negative voltage of the lithium ion battery 17 and the positive voltage of the lithium ion battery 18 are connected by a low resistance bus bar 908 in which a resistor such as manganin is joined. When manganin is used, it is preferable to other resistors because high precision can be secured in the voltage usage range of the lithium ion secondary batteries 11 and 12.

The respective inter-cell bus bars are aggregated into the connector 30 by cell voltage detection lines 101 to 116 and connected to the battery control unit.

FIG. 5 shows an electric circuit in which the configuration of FIG. 4 is illustrated. The fourteen cells in FIG. 4 are configured to be connected to the battery control unit from an array-shaped configuration connected in series. The C8 terminal of the cell voltage monitoring IC 210 is connected to the positive voltage of lithium ion battery 17 and the sum of the voltages which is voltage-dropped to the positive and negative electrodes by the currents of the lithium ion battery 17 and the low resistance inter-cell bus bar is input to the cell voltage 288. As described above, the subsequent processing is configured to obtain the current by calculation.

The features of the invention will be briefly summarized. In a vehicle equipped with a lithium ion battery, it is necessary to measure the current flowing in the lithium ion battery and feed the result back to the vehicle control so that the lithium ion battery is controlled so as not to become in a dangerous state such as overcharge and overdischarge. In the related art, it is controlled by disposing a current sensor on a current path of the lithium ion battery. Since the current sensor is constituted of a magnetic core and a circuit board on which a Hall IC is mounted and disposed in the middle of the current path, it is necessary to secure a layout space. According to the invention, any one of the bus bars connecting the lithium ion batteries is replaced by a bus bar including a resistor and the current is measured by calculation using a voltage input measuring system of the cell voltage monitoring IC.

In order to solve the problem described above, a battery pack of the invention includes a battery group in which a plurality of battery cells (lithium ion battery 11, 12) are connected in series, a resistor (bus bar 20) connected in series to the battery group, cell voltage detection lines (cell voltage detection lines 101 to 104) arranged at both ends of the battery cells (lithium ion battery 11, 12) and the resistor (bus bar 20), and a battery controller connected to the cell voltage detection lines (cell voltage detection lines 101 to 104), in which one cell voltage detection line (cell voltage detection lines 101 to 104) adjacent to the battery cell (lithium ion battery 11, 12) has a terminal which is branched and connected to the battery controller. By adopting such a structure, it becomes possible to measure the current value flowing in the lithium ion battery without providing an additional current sensor. Since the number of the current sensors is reduced, cost reduction by the current sensor is achieved as compared with the prior art. Further, the number of the current sensors is reduced and this contributes to volume reduction of the battery pack. In addition, in the invention, a structure is adopted in which the low resistance bus bar 20 is disposed between the lithium ion battery 11 and the lithium ion battery 12. By adopting such a structure, it is possible to improve the current detection accuracy within the cell voltage usage range.

Further, a current sensor is further provided in the battery pack of the invention. By adopting such a configuration, the current detection can be performed by a double system. Therefore, it is possible to improve the reliability of the obtained current value and failure of the bus bar and failure of the current sensor can be monitored with each other.

In the battery pack according to the invention, the battery controller 210 calculates a current flowing through the resistor (bus bar 20) in synchronization with voltage detection of the battery cell. By adopting such a configuration, there is no deviation in the voltage value acquired by the voltage detection of the battery cell and the voltage detection of the resistor (bus bar 20), so that the accuracy of the acquired current value is improved.

In the battery pack according to the invention, the battery controller 210 calculates the current by subtracting a voltage applied to the battery cell from a sum of a voltage applied to the battery cell and a voltage applied to the resistor (bus bar 20) and dividing the voltage applied to the resistor by a resistance value of the resistor.

In the battery pack according to the invention, manganin is used for the bus bar 20. By adopting such a configuration, it is possible to ensure high accuracy in a usage range where the lithium ion batteries 11 and 12 are used.

Hereinbefore, the embodiments of the invention have been described in detail. However, the invention is not limited to the embodiments described above and various design changes can be made in a range without departing from the spirit of the invention described in the claims. For example, the embodiments described above have been described in detail in order to explain the invention in an easy-to-understand manner and are not necessarily limited to those having all the described configurations. In addition, a part of the configuration of one embodiment can be replaced by the configuration of another embodiment and the configuration of another embodiment can be added to the configuration of one embodiment. Further, it is possible to add, delete, or replace other configurations with respect to part of the configuration of each embodiment.

REFERENCE SIGNS LIST 11 to 24: lithium ion battery
30: connector
40: low resistance bus bar
101 to 116: cell voltage detection line
201: battery control unit
210: cell voltage monitoring IC
220: MUX
230: ADC
231: insulation communication unit
240, 241, 242, 243, 244: filter resistor
260, 261, 262, 263: filter capacitor
280, 281, 282, 283: cell voltage
300: MPU
301, 302: calculation portion
303: subtractor
304: divider
305: ROM table
310: current value
440, 441, 442, 445: capacity adjustment resistor
461, 462: capacity adjustment filter capacitor
480, 481, 482, 483: capacity adjustment switch
901 to 907, 909 to 915: inter-cell bus bar
908: low resistance inter-cell bus bar

The invention claimed is:

1. A battery pack comprising:
a battery group in which a plurality of battery cells are connected in series;
a resistor connected in series to the battery group;
cell voltage detection lines arranged at both ends of the battery cells and the resistor;
one or more capacity adjustment switches in connection with the cell voltage detection lines, wherein a voltage associated with the capacity adjustment switches when the capacity adjustment switches are in an ON state indicates disconnection of the cell voltage detection lines during a disconnection diagnosis; and
a battery controller connected to the cell voltage detection lines, wherein
one of the cell voltage detection lines, which is adjacent to one of the battery cells, includes a terminal which is branched and connected to the battery controller;
wherein a first side of at least one of the one or more capacity adjustment switches is connected to a positive terminal of a first battery cell of the plurality of battery cells via a first capacity adjustment resistor and a second side of the at least one of the more capacity adjustment switches is connected to a negative terminal of a first battery cell of the plurality of battery cells via a second capacity adjustment resistor; and
wherein the at least one of the one or more capacity adjustment switches is configured to switch to an OFF state a predetermined amount of time after being in the ON state, which causes the disconnection diagnosis to finish.

2. The battery pack according to claim 1, wherein the battery pack is further provided with a current sensor.

3. The battery pack according to claim 1, wherein the battery controller calculates a current flowing through the resistor in synchronization with voltage detection of the battery cell.

4. The battery pack according to claim 1, wherein the battery controller calculates a current by subtracting a voltage applied to the battery cell from a sum of a voltage applied to the battery cell and a voltage applied to the resistor and dividing the voltage applied to the resistor by a resistance value of the resistor.

5. The battery pack according to claim 1, wherein the resistor is a bus bar connected between the battery cells.

6. The battery pack according to claim 5, wherein the bus bar comprises manganin.

7. The battery pack according to claim 1, further comprising a microprocessor unit (MPU) in connection with the one or more capacity adjustment switches.

8. The battery pack according to claim 7, wherein the MPU is configured to store a plurality of cell voltages sequentially.

9. The battery pack according to claim 7, wherein the MPU is configured to control the one or more capacity adjustment switches.

* * * * *